United States Patent
Nomura et al.

(10) Patent No.: US 6,304,148 B1
(45) Date of Patent: Oct. 16, 2001

(54) OSCILLATOR CIRCUIT FOR A SEMICONDUCTOR MEMORY HAVING A TEMPERATURE DEPENDENT CYCLE

(75) Inventors: Masayoshi Nomura, Kawasaki; Akimitsu Mimura; Yuji Yokoyama, both of Ome; Tsugio Takahashi, Hamura, all of (JP)

(73) Assignees: Texas Instruments Incorporated, Dallas, TX (US); Hitachi, Ltd., Tokyo (JP)

( * ) Notice: Subject to any disclaimer, the term of this patent is extended or adjusted under 35 U.S.C. 154(b) by 0 days.

(21) Appl. No.: 09/146,307

(22) Filed: Sep. 3, 1998

(51) Int. Cl.[7] ....................................... H03B 1/00
(52) U.S. Cl. .................. 331/57; 331/66; 326/95
(58) Field of Search ................. 331/57, 66, 176; 326/32, 95

(56) References Cited

U.S. PATENT DOCUMENTS 5,426,398 * 6/1995 Kuo .......................................... 331/57
5,600,281 * 2/1997 Morie et al. ............................. 331/57
5,744,999 * 4/1998 Kim et al. ............................. 327/543

* cited by examiner

*Primary Examiner*—Robert Pascal
*Assistant Examiner*—Kimberly E Glenn
(74) *Attorney, Agent, or Firm*—Bret J. Peterson; Frederick J. Telecky, Jr.

(57) ABSTRACT

An oscilator circuit for a integrated circuit memory device to optimize the refresh operating circuit and suppress wasteful power consumption in which the oscillator frequency is set high during high temperatures and the oscillator frequency is set low during low temperatures. A current $I_1$ is generated by means of the current source 100a having characteristics in which it is increased during high temperatures and decreased during low temperatures, and is supplied to the ring oscillator 200. A current corresponding to the current $I_1$ is supplied to each inverter in the frame oscillator 200, and since the oscillator frequency is controlled by means of the current value of the supplied current, the frequency of the clock signal CLK generated increases accompanying a rise in temperature, and since the refresh operation is conducted based on the clock signal CLK, the data holding capabilities can be ensured during high temperatures, wasteful power consumption can be reduced during low temperatures, and optimization of the refresh operating frequency can be realized.

7 Claims, 4 Drawing Sheets

OSCILLATOR CIRCUIT FOR A SEMICONDUCTOR MEMORY HAVING A TEMPERATURE DEPENDENT CYCLE

FIELD OF THE INVENTION

This invention relates to an oscillator circuit, specifically, to an oscillator circuit for the purpose of generating a clock signal used in the refresh circuit of a DRAM.

BACKGROUND OF THE INVENTION

A dynamic random-access memory (DRAM), is typically constructed of memory cells comprising one transistor and one capacitor. A larger capacity memory thus can be realized when the memory cell area is reduced in size. Because the storage of data is accomplished by holding a charge on the capacitor, there is the problem that, with the passage of time, the charge held in the capacitor discharges, and the storage data is lost. In order to accurately save the stored data, a DRAM typically includes the so-called refresh operation. The refresh operation performs a rewrite of the data for the memory cells at a fixed time spacing. A self-refresh circuit is typically provided in the ordinary DRAM to control the refresh operation.

Figure 5:
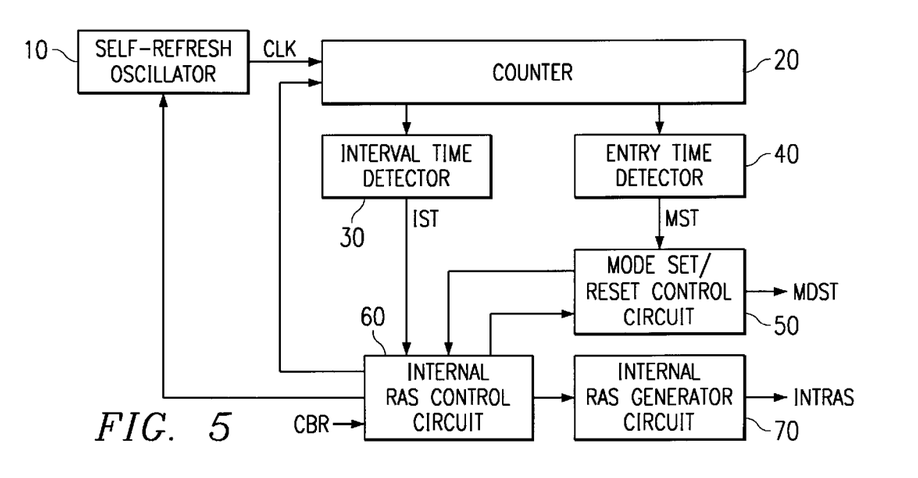
FIG. 5 is a block diagram showing the construction of the refresh circuit.

FIG. 5 is a schematic showing one construction example of a self-refresh circuit. The self-refresh circuit shown in the figure is constructed by means of the self-refresh oscillator 10, the counter 20, the interval time detector 30, the entry time detector 40, the mode set/reset control circuit 50, the internal RAS control circuit 60, and the internal RAS generator circuit 70.

The self-refresh circuit is started by means of a control signal CBR. The counter 20 starts the count in response to a clock signal CLK sent from the self-refresh oscillator 10, and the count value CNT is output to the interval time detector 30 and the entry time detector 40.

A value corresponding to the desired interval time is set in the interval time detector 30, and a value corresponding to the desired entry time is set in the entry time detector 40, respectively. If the value set as the entry time and the counter value CNT match in the entry time detector 40, a mode set signal MST is output, the refresh mode is set by means of a mode set/reset control signal 50 in response to this, and the mode signal MDST is switched, for example, from a low level to a high level.

By this means, the pulse signal INTRAS for the purpose of the internal refresh is generated by means of the internal RAS generator circuit 70, and output. At the same time, the counter 20 is reset by means of the internal RAS control signal circuit 60, and the count is newly begun. When the count value CNT and a value that was set beforehand in the interval time detector 30 match, the control signal IST is output from the interval time detector 30, and in response to this a pulse signal INTRAS is newly sent by means of the internal RAS generator circuit 70. Then, the counter 20 is again reset by means of the internal RAS control circuit 60, and the count is begun. This operation is repeatedly conducted until the control signal CBR is reset, the pulse signal INTRAS is generated by means of the self-refresh circuit, and the refresh of the DRAM is conducted in response to this.

Figure 6:
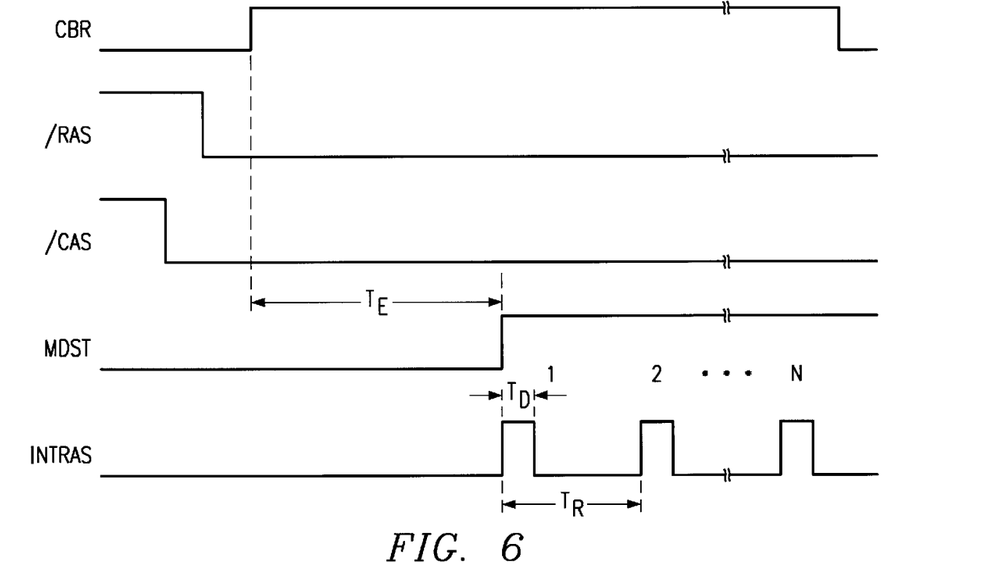
FIG. 6 is a waveform chart showing the operation of the refresh circuit.

FIG. 6 is a waveform chart showing the operation of the self-refresh circuit. As is illustrated, when the control signal CBR is placed in the active state, for example, in the state of a high level, the self-refresh circuit is started. The counter 20 is started by means of the internal RAS control circuit 60, and the counter operation by means of the counter 20 is initiated. Also, as for the self-refresh oscillator 10, when the control signal CBR is set to the high level, its oscillation operation is reset by means of the internal RAS control circuit 60.

The count value from the counter 20 and the preset value are compared by means of the entry time detector 40, and if matching, the mode control signal MST is generated, and is output to the mode set/reset control circuit 50. In response to this, the mode signal MDST is switched from the low level to the high level by means of the mode set/reset control circuit 50, and the refresh mode is set. The time $T_E$ from when the control signal CBR is set to the active state until the mode signal MDST is switched to the high level is the entry time, and is controlled by means of the entry time detector 40.

When it is set to the refresh mode, the first pulse signal INTRAS is generated by means of the internal RAS generator circuit 70 and is output, the counter 20 is reset in response to this, and a new count is begun. When the count value CNT matches the value set beforehand in the interval time detector circuit 30, the control signal IST is output by means of the interval time detector 30, and the second pulse signal INTRAS is generated by means of the internal RAS generator circuit 70 in response to this. The counter 20 is again reset in response to this pulse signal INTRAS, and the count is begun.

The spacing $T_R$ for the second and the first pulse signals INTRAS is controlled by means of the interval time detector 30. Also, the width $T_D$ for the pulse signal INTRAS is controlled, for example, by means of the delayed time of the delay circuit provided in the internal RAS generator circuit 70. In the case of a 64 Mb DRAM, the spacing $T_R$ for the pulse signal INTRAS is set, for example, to 16 $\mu$s, and the pulse with $T_D$ of the pulse signal INTRAS, for example, is set to 50–60 ns.

The above-mentioned operation is repeatedly conducted, and the pulse signal INTRAS is repeatedly generated for the cycle $T_R$ until the control signal CBR is reset to the low level. The time from when the control signal CBR is set, and the initial pulse signals INTRAS is generated, until the final pulse signal INTRAS is ended, is one cycle of the refresh operations. For example, in the case of a 64 Mb DRAM, all of the memory cells are refreshed by means of the pulse signal INTRAS being generated 4096 times. As mentioned above, in the event the cycle $T_R$ for the pulse signal INTRAS is 16 $\mu$s, one cycle for the refresh becomes (16 $\mu$s×4096 =65.5 ms).

Figure 7A:
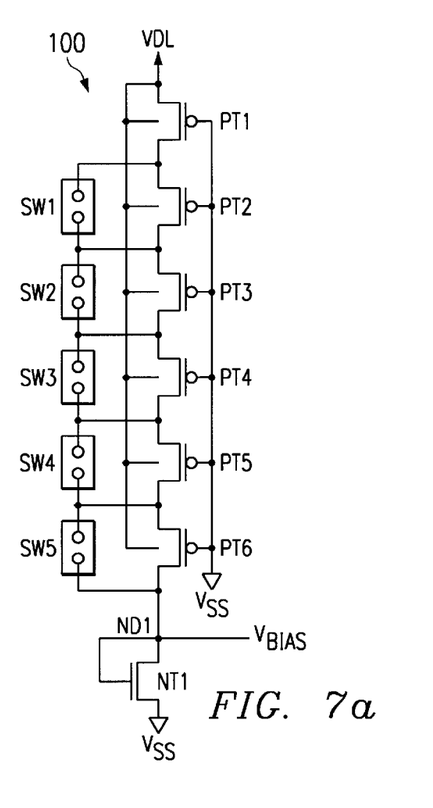
FIG. 7 is a diagram showing the construction of the current source in the oscillator circuit and its equivalent circuit.
Figure 7B:
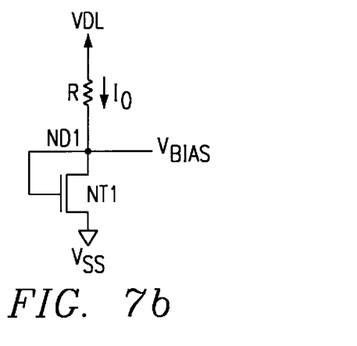

The self-refresh oscillator 10, for example, is constructed by means of a ring oscillator constructed by means of connecting an odd number of stages of inverters in a ring configuration and a current source that supplies current to the oscillator. One construction example of the current supply circuit is shown in FIG. 7. FIG. 7(a) is a schematic of the current source circuit 100, and FIG. 7(b) shows its equivalent circuit.

As is shown in FIG. 7(a), the current source circuit 100 is constructed by means of the pMOS transistors PT1, PT2, PT3, PT4, PT5, PT6, switches SW1, SW2, SW3, SW4, SW5, and the nMOS transistor NT1.

The pMOS transistors PT1 to PT6 are connected in series between the power supply voltage VDL and the node ND1. The gates of these pMOS transistors are connected to the common potential $V_{ss}$, and their base regions back gates are connected in common to the power supply voltage VDL. Also, the switches SW1, SW2, SW3, SW4, SW5 are respectively connected between the source and drain of the pMOS transistors PT2, PT3, PT4, PT5, PT6.

The switches SW1 to SW 5, for example, are constructed by means of metal switches.

Since the pMOS transistors PT1 to PT6 are constructed by linear type regions, the partial circuits constructed by means of these transistors can be considered as being replaced by resistive elements R having prescribed resistance values. By this means, the current source circuit 100 can be simplified by means of the equivalent circuit shown in FIG. 7(b). In other words, the current source circuit 100 can be shown by means of the resistive element R that is connected between the power supply voltage VDL and the node ND1, and the nMOS transistor NT1 that is diode connected. The gate and drain of the nMOS transistor NT1 are connected in common to the node ND1, and the source is connected to the common potential $V_{ss}$. The bias voltage $V_{BIAS}$ is output by means of the node ND1. Also, the node ND1 is connected to the gate of each nMOS transistor that supplies current to the inverter that constructs the oscillator, and a current mirror current source is constructed by means of these MOS transistors and the nMOS transistor NT1.

Here, by means of regulating the ON/OFF state of the switches SW1 to SW5, the resistance values of the equivalent resistive elements R of the pMOS transistors PT1 to PT6 are controlled, and the current value supplied to the oscillator the current mirror circuit in it is controlled in response to this. The oscillating frequency of the oscillator is controlled by means of the current value supplied. When the supplied current is large the oscillator frequency is controlled to be high, and conversely, when the supplied current is small the oscillator frequency is controlled to be low.

In other words, the frequency of the clock signal CLK generated by means of the oscillator is controlled in response to the amount of current supplied to the oscillator. Since the self-refresh circuit conducts a count of the counter 20 in response to the clock signal CLK from the self-refresh oscillator 10, and generates the pulse signal INTRAS, the frequency of the pulse signal INTRAS for the purpose of the refresh is controlled in response to the frequency of the clock signal CLK generated by means of the self-refresh oscillator 10.

In the above-mentioned oscillator circuit used in the past, the current value supplied from the current source circuit changes due to the temperature characteristics of the MOS transistors, and there is the disadvantage that the frequency of the clock signal CLK generated in response to that will fluctuate.

For example, there is a tendency for the threshold voltage $V_{th}$ of the MOS transistors to drop accompanying a temperature rise, and the drain current of the MOS transistor has a negative temperature characteristic temperature-dependent characteristic. Because of this, in the current source circuit, the current supplied to the node ND1 through the medium of the pMOS transistors drops due to a temperature rise, and since, as a result, the current value supplied to the oscillator drops during high temperatures, it has a characteristic in which the frequency of the clock signal CLK drops accompanying a temperature rise, which is the so-called negative temperature coefficient.

On the other hand, in the memory cell of the DRAM, the leakage current of the memory cell increases accompanying a temperature rise, and the data holding characteristics of the memory cell worsens. In order to accurately hold the storage data, it is necessary to make the refresh operating cycle short during high temperatures, in other words, to set the refresh operating frequency high.

Figure 8:
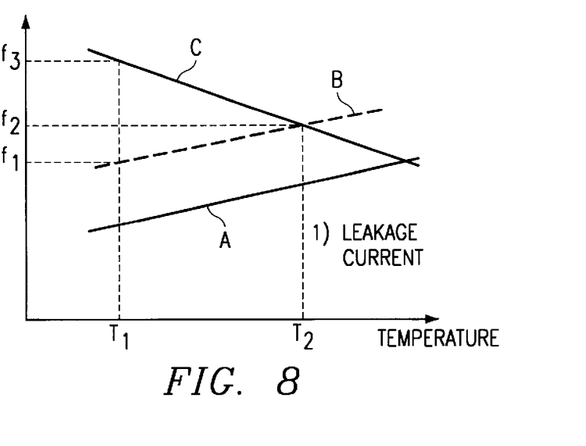
FIG. 8 is a graph showing the leakage current due to temperature changes and the changes in the oscillator frequency of the oscillator circuit.

FIG. 8 shows the changes of the leakage current of the memory cell and the changes of the refresh frequency in response to temperature changes. In FIG. 8, A shows the changes of the leakage current of the transistor in response to the temperature changes, B shows the changes of the refresh cycle necessary in order to accurately maintain the storage data of the memory device, based on the changes in the leakage current, and C shows the actual changes of the refresh frequency undergoing the influence of temperature changes.

As is illustrated, the semiconductor memory device, for example, is assumed to operate in the temperature range of from temperature $T_1$ to $T_2$. At the high temperature side of $T_2$ the leakage current is large, and the necessary refresh frequency is set to $f_2$ based on that. On the other hand, at the low temperature side of $T_1$, since the leakage current is reduced, the necessary refresh frequency is $f_1$. However, as is illustrated, since the oscillator frequency of the oscillator circuit rises during a low temperature, the actually obtained refresh frequency becomes $f_3$. In other words, due to the fact that the refresh is conducted more than necessary during a low temperature, needless electrical power is consumed.

In this way, in the ordinary DRAM, since the frequency for the refresh operation is set to match the data holding characteristics of the memory cell during high temperature, at low temperature, since the data holding characteristics of the memory cell become good, this means that the refresh is needlessly conducted during low temperature. In the DRAM, the change to a low power consumption for the self-refresh mode is an important problem. In order to suppress the power consumption as much as is possible, it is essential that the frequency of the refresh operations be optimized in response to the ambient temperature. At that time, the temperature characteristics of the self-refresh oscillator 10 become a hindrance to the optimization.

This invention was made looking back at this type of information, and its purpose is to offer an oscillator circuit that can realize an oscillator circuit in which the oscillating frequency is set high during high temperature and in which the oscillating frequency is set low during low temperature, that can optimize the refresh operating frequency in response to this, and which can suppress needless power consumption.

SUMMARY OF THE INVENTION

In order to achieve the above-mentioned purposes, the oscillator circuit of this invention has a ring oscillator wherein an odd number of signal inverting means connected in series, a current supply means for the purpose of supplying current to the above-mentioned signal inverting means, and a reference current generating circuit that generates a reference current having positive temperature characteristics that becomes the reference for the current which the above-mentioned current supply circuit supplies.

Ideally, the above-mentioned signal inverting means is constructed of CMOS inverters, the above-mentioned current supply means contains pMOS transistors and nMOS transistors that are connected between the power supply terminal and the ground terminal, the above-mentioned reference current generating circuit contains a diode-connected first MOS transistor, a resistance means, and a diode-connected second MOS transistor that are connected between the power supply terminal and the ground terminal; and the above-mentioned pMOS transistor and the above-mentioned first MOS transistor, and the above-mentioned nMOS transistor and the above-mentioned second MOS transistor, construct a current mirror circuit.

Also, ideally, the above-mentioned resistance means is constructed of MOS transistors.

According to this invention, since the oscillator circuit is constructed of an oscillating means in which the oscillating frequency becomes high when the supply current increases, and a reference current generator circuit that generates a reference current having positive temperature characteristics, an oscillator signal having a positive temperature characteristic can be obtained. Therefore, when a refresh signal for the DRAM is generated based on this oscillator signal, since the refresh oscillating frequency can be set high during high temperatures, and the refresh operating frequency can be set low during low temperatures, the power consumption accompanying the refresh can be reduced while maintaining the data holding performance of the memory device DRAM during high temperatures.

As was explained above, according to the oscillator circuit of this invention, the oscillator frequency is controlled in response to temperature changes, and since the oscillator frequency is set high during high temperatures, and the oscillator frequency is set low during low temperatures, by means of conducting the refresh of the semiconductor memory device in response to this, it has the advantages that the memory data is accurately held during high temperatures, and the wasteful consumption of power can be prevented during low temperatures.

REFERENCE NUMERALS AND SYMBOLS AS SHOWN IN THE DRAWINGS

In the figures, 10 represents a self-refresh oscillator, 20 a counter, 30 an interval time detector, 40 an entry time detector, 50 a mode set/reset control circuit, 60 an internal RAS control circuit, 70 an internal RAS generator circuit, 100, 100a, and 100b a current source, NT0 and NT1 a nMOS transistor, PT1, PT2, PT3, PT4, PT5, and PT6 are pMOS transistors, SW1, SW2, SW3, SW4, SW5 are switches, OPA1 an op-amp, 200 a ring oscillator, N1 to N9 and NI1 to N16 are nMOS transistors, P1 to P8 and PI1 to Pi6 are pMOS transistors, INV1 to INV7 are inverters, C11, C12, C21, C22, C31, C32, C41, C42, C51, and C52 are capacitors, VDL a power supply voltage, $V_{ss}$ a common potential.

DESCRIPTION OF EMBODIMENTS

Embodiment 1

Figure 1:
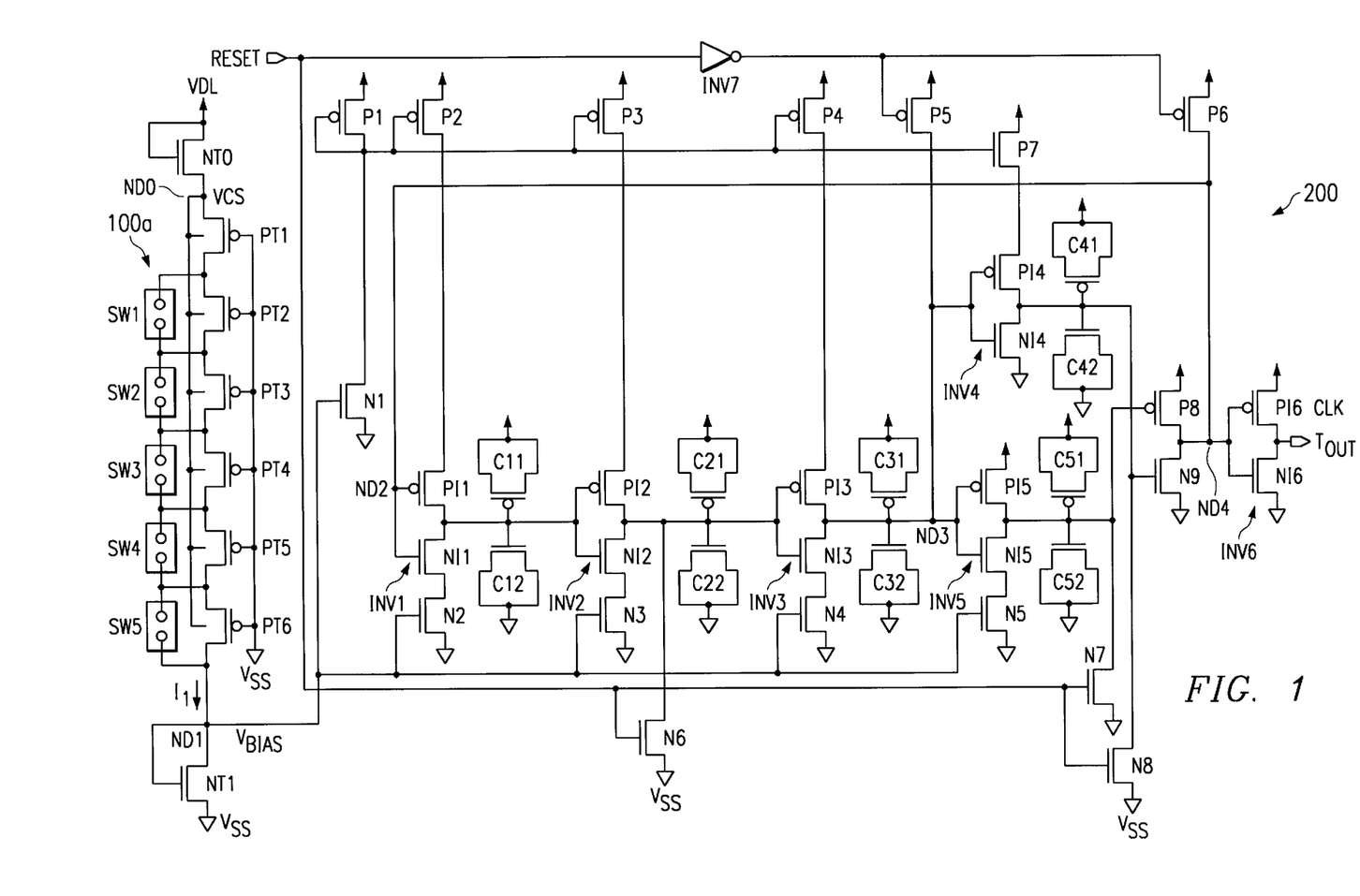
FIG. 1 is a schematic diagram showing Embodiment 1 of an oscillator circuit related to this invention.

FIG. 1 is a circuit diagram showing Embodiment 1 of an oscillator circuit related to this invention.

The oscillator circuit of this embodiment is constructed by means of the current source 100a and the ring oscillator 200. The current source 100a generates the current $I_1$, the current corresponding to this current $I_1$ is supplied to each structural component of the ring oscillator 200, the ring oscillator 200 conducts oscillating operations in response to this, and outputs a clock signal CLK having the prescribed oscillator frequency.

FIG. 2 is a circuit diagram showing the construction of the current source 100a and a circuit diagram of an equivalent circuit.

Figure 2A:
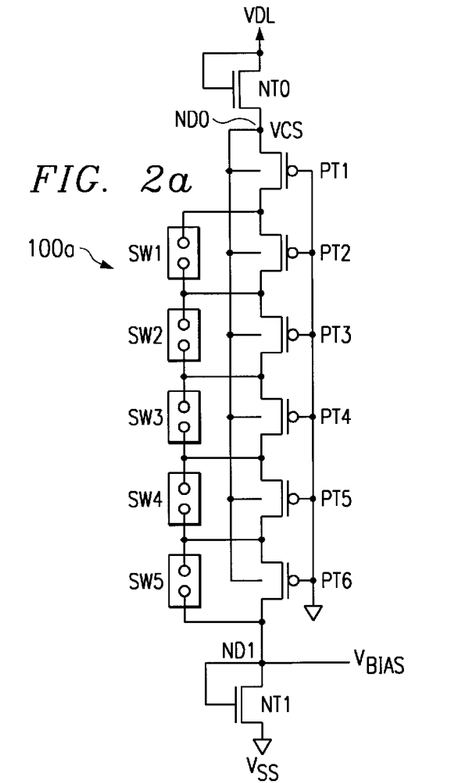
FIG. 2 is a diagram showing the construction of the current source in the oscillator circuit and its equivalent circuit.

As is shown in FIG. 2(a), the current source 10 is constructed of the nMOS transistors NT0, NT1, the pMOS transistors PT1, PT2, PT3, PT4, PT5, PT6 and switches SW1, SW2, SW3, SW4, SW5.

The nMOS transistor NT0 is diode-connected. In other words, both the gate and drain of the nMOS transistor NT0 are connected to the power supply voltage VDL, and the source is connected to the node ND0. Here, if the threshold voltage for the nMOS transistor NT0 is taken to be $V_{th0}$, the voltage VCS for the node ND0 becomes $VDL-V_{th0}$. Now then, since current is actually flowing in the nMOS transistor NT0, the voltage drop of the nMOS transistor NT0 becomes a voltage that is slightly higher than the threshold voltage $V_{th0}$.

The pMOS transistors PT1 to PT6 are connected in series between the node ND0 and the node ND1. The gates of the pMOS transistors are connected in common to the common potential $V_{ss}$, their base regions back gates are connected in common to the node ND0, and are biased by means of the voltage VCS. Also, the switches SW1, SW2, SW3, SW4, SW5 are connected between the pMOS transistors PT2, PT3, PT4, PT5, PT6.

The nMOS transistor NT1 is also diode-connected, in other words, the gate and drain of the nMOS transistor NT1 are connected in common to the node ND1, and the source is connected to the common potential $V_{ss}$. Because of this, the voltage $V_{BIAS}$ of the node ND1 is maintained at a voltage slightly higher than the threshold voltage $V_{th1}$ of the nMOS transistor NT1.

Figure 2B:
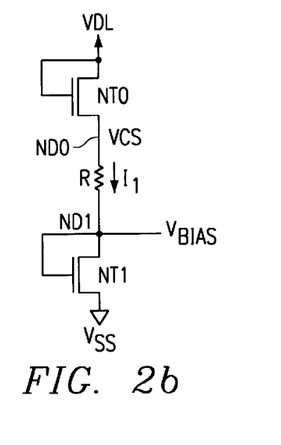

The section constructed by means of the pMOS transistor PT1 to PT6 is equivalently displayed by means of the resistive element R as is shown in FIG. 2(b). Also, the resistance value of the equivalent resistive element can be controlled by means of regulating the ON/OFF state of the switches SW1 to SW5. For example, if all of the switches SW1 to SW5 are placed in the ON conducting state, the resistance value of the equivalent resistor R equivalently becomes a value equal to the ON resistance of the pMOS transistor PT1.

According to the equivalent circuit of FIG. 2(b), the current$_1$ that flows in the resistant element R can be found by means of the following equation.

$$I_1 = VCS - V_{BIAS}/r \qquad \text{[Equation 1]}$$

In Equation 1, VCS is a given set voltage, r is the resistance value of the equivalent resistant element R, and is the ON resistance of the pMOS transistors connected in series. Also, $V_{BIAS}$ is a voltage slightly higher than the threshold voltage $V_{th1}$ of the nMOS transistor NT1. The temperature coefficient of r that is the denominator of this equation is positive due to the drain current characteristics of the pMOS transistors. In other words, the resistance value r increases with a rise in temperature. Also, the temperature characteristics for VCS–$V_{BIAS}$, which is the numerator, are also positive in the same manner. This is because the temperature coefficient for the voltage $V_{hd\ BIAS}$ also becomes negative, because the threshold voltage $V_{th1}$ of the nMOS transistor has a negative temperature dependency.

By this means, if the value of the voltage VCS is selected so that the temperature coefficient for the numerator VCS–$V_{hd\ BIAS}$ exceeds the temperature coefficient of the denominator r, the current $I_1$ has an increasing characteristic during high temperatures; in other words, it is made so as to have a positive temperature coefficient. In the case of this embodiment, the fact was confirmed by means of circuit simulation that the oscillating frequency of the ring oscillator 200 has a positive temperature characteristic when the voltage VCS is 1.7 V or less. In this example, when the power supply voltage VDL was made 2.2 V, and the voltage drop due to the threshold voltage $V_{th0}$ of the nMOS transistor NT0 was made about 0.8 V, the voltage VCS became 1.4 V, and VCS <1.7 V was realized.

In this embodiment, for purposes of explanation, the resistive element R was taken to be constructed by means of the six pMOS transistors PT1 to PT6, and five switches SW1 to SW5 were used for the purpose of controlling the resistance value r of the resistive element R, but this invention is not limited to this, and the number of switches and pMOS transistors that construct the resistive element R can be set in response to actual conditions.

The ring oscillator 200 is an oscillator constructed by means using an odd number of delay elements made up of the inverters and the capacitors connected to their output sides, and feeding the output signal of the final stage of the delay elements to the input side of the first stage of the delay elements. As is shown in FIG. 1, in the ring oscillator 200, the respective inverters INV1, INV2, INV3, INV4, INV5, INV6 are constructed by means of the pMOS transistors PI1, PI2, PI3, PI4, PI5, PI6 and the nMOS transistors NI1, NI2, NI3, NI4, NI5, NI6, respectively. The inverters INV1, INV2, INV3 are connected in series between the node ND2 and the node ND3. The capacitors C11 and C12 are connected to the output terminal of the inverter INV1, the capacitors C21 and C22 are connected to the output terminal of the inverter INV2, and the capacitors C31 and C32 are connected to the output terminal of the inverter INV3. These capacitors are constructed by means of nMOS transistors and pMOS transistors in which the gate is connected to the output terminal of the inverter and the source and drain are connected to the power supply voltage VDL and the common potential $V_{ss}$. For example, the capacitor C11 is constructed by means of a pMOS transistor in which the gate is connected to the output terminal of the inverter INV1 and the source and drain are both connected to the power supply voltage VDL, and the capacitor C12 is constructed by means of an nMOS transistor in which the gate is connected to the output terminal of the inverter INV1 and the source and drain are both connected to the common potential $V_{ss}$.

The input terminal of the inverter INV4 constructed by means of the pMOS transistor P14 and the nMOS transistor NI4 is connected to the node ND3, and its output terminal is connected to the gate of the nMOS transistor N9. Also, the capacitors C41 and C42 are connected to the output terminal of the inverter INV4. On the other hand, the input terminal of the inverter INV5 constructed by means of the pMOS transistor P15 and the nMOS transistor NI5 is connected to this same node ND3, and its output terminal is connected to the gate of the pMOS transistor P8. Also, the capacitors C51 and C52 are connected to the output terminal of the inverter INV5.

The source of the pMOS transistor P8 is connected to the power supply voltage VDL, the source of the nMOS transistor N9 is connected to the common potential $V_{ss}$, and the gates of these transistors are connected in common to the node ND4. The inverter INV6 is constructed by means of the pMOS transistor PI6 and the nMOS transistor NI6, the input terminal of the inverter INV6 is connected to the node ND4, and the output terminal is connected to the output terminal $T_{OUT}$ for the clock signal CLK. Also, the node ND4 is connected to the node ND2, and by this means, if the output signal of the final stage inverter connected in series is fed back to the input terminal of the first stage inverter, the ring oscillator is formed.

The delay elements are constructed by means of the inverters INV1, INV2, INV3, INV4, INV5 and the capacitors connected to the output terminals of these inverters. The charging speed for the capacitors that accompanies the state of inversion of these inverters changes in response to the current supplied to each inverter INV1, INV2, INV3, INV4, INV5. The greater the current supplied to the inverter, the higher the charging speed for the capacitor, the delay time for the delay element constructed by means of the inverter and capacitor is shortened, and the oscillating frequency of the ring oscillator 200 becomes higher. In other words, the oscillating frequency of the ring oscillator is controlled by means of the current supplied to the inverters.

The pMOS transistors P1, P2, P3, P4, P7 construct the current mirror circuit that supplies constant current to the respective inverters INV1, INV2, INV3, INV4. As is illustrated, the sources of these transistors are connected in common to the power supply voltage VDL, and the gates are connected in common. Also, the gate and drain of the pMOS transistor P1 are connected in common. Because of this, a constant current flows in the drains of the pMOS transistors P2, P3, P4, corresponding to the current that flows in the pMOS transistor P1, and is supplied to the respective inverters INV1, INV2, INV3, INV4. In the event the drive capabilities of the pMOS transistors P1, P2, P3, P4, P7 are set the same, a current that is the same as the current that flows in the pMOS transistor P1 is supplied to the inverters INV1, INV2, INV3, INV4.

The nMOS transistors N1, N2, N3, N4, N5, along with the nMOS transistor NT1 that constructs the current source 100a, constructs the current mirror circuit that supplies the constant current. The sources of these nMOS transistors are all connected in common to the common potential $V_{ss}$, and the gates are connected in common to the node ND1 of the current source 100a. Because of this, a set current corresponding to the current $I_1$ that flows in the current source 100a flows in the drains of the nMOS transistors N1, N2, N3, N4, N5. In the event the nMOS transistors N1, N2, N3, N4, N5 are set to the same drive capability as that of the nMOS transistor ND1 of the current supply 100a, a current that is the same as the current $I_1$ that is generated by means of the current source 100a is supplied to the common potential $V_{ss}$ from the inverters INV1, INV2, INV3, INV5.

Also, since the drain of the nMOS transistor N1 is connected in common with the gate and drain of the pMOS transistor P1, about the same current flows in the pMOS transistor P1 and the nMOS transistor N1. In other words, the same constant current is supplied to the inverters INV1, INV2, INV3, INV4 by means of the pMOS transistors P1, P2, P3, P4, P7 and the nMOS transistors N1, N2, N3, N4, N5. Also, the current value of the constant current supplied to these inverters is set in response to the current $I_1$ generated by means of the current source 100a. Because of this, the frequency of the clock signal CLK generated by means of the ring oscillator 200 is controlled by means of the current $I_1$ generated by means of the current source 100a. As was presented above, in this embodiment, since the constant current$_1$ generated by means of the current source 100a has a positive temperature characteristic, and the oscillator frequency of the ring oscillator 200 becomes higher the larger the current $I_1$ supplied from the current source 100 output, the frequency of the clock signal CLK generated by means of the ring oscillator 200 also has a positive temperature characteristic. In other words, the frequency of the clock signal CLK rises with the temperature rise, and conversely, the frequency of the clock signal CLK also drops accompanying a temperature drop.

In the ring oscillator 200, the pMOS transistors P5, P6 and the nMOS transistors N6, N7, N8 initialize the circuit in response to the reset signal RESET output from the internal RAS control circuit 60; in other words, these are provided for the purpose of obtaining synchronization with the control signals CBR. When the reset signal RESET is an H level, the ring oscillator 200 is in a quiescent state, and when the reset signal RESET is an L level, the ring oscillator 200 is in an oscillating state.

Figure 3:
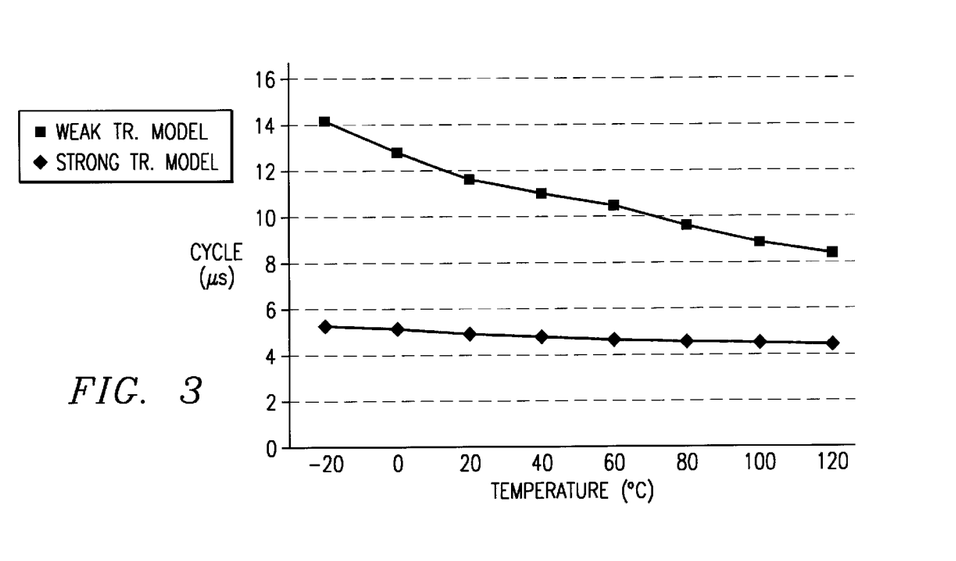
FIG. 3 is a graph showing the relationship between the oscillator frequency and the temperature in a simulation.

FIG. 3 shows the relationship between the period of the clock signal CLK generated by means of the oscillator circuit of this embodiment and the temperature. The relationship between the oscillating frequency and the temperature derived by means of simulations are shown in FIG. 3 in regard to the two operating modes of the low-speed operation (Weak TR. model) and the high-speed operation (Strong TR. model), respectively. In either of these cases, the oscillating period drops accompanying a temperature rise, therefore, the so-called positive temperature characteristic can be obtained in which the oscillating frequency rises.

In the above explanation, the ring oscillator 200 was constructed by equivalently connecting in series four stages of the delay elements and one stage of an inverter, and the inverter had a total of five stages, but this invention is not limited by this, and the total number of stages for the inverter can be set to any optional odd number. However, since the oscillator frequency changes in response to the number of stages of delay elements and inverters that construct the ring oscillator, in the actual circuit design, the number of stages for the ring oscillator are determined based on the desired oscillator frequency.

As was explained above, according to this embodiment, a current $I_1$ was generated having a positive temperature characteristic by means of the current source 100a, and was supplied to a ring oscillator 200 in which the oscillator frequency became higher accompanying an increase in the current supplied. In the ring oscillator 200, since the current set in response to the current $I_1$ is supplied to each inverter, and the oscillator frequency is controlled in response to the current value of these currents, the frequency of the generated clock signal CLK increases, accompanying a rise in temperature, and by conducting a refresh operation based on the clock signal CLK, the data holding capabilities during high temperatures are ensured, and the wasteful consumption of power during low temperatures can be suppressed.

Embodiment 2

Figure 4:
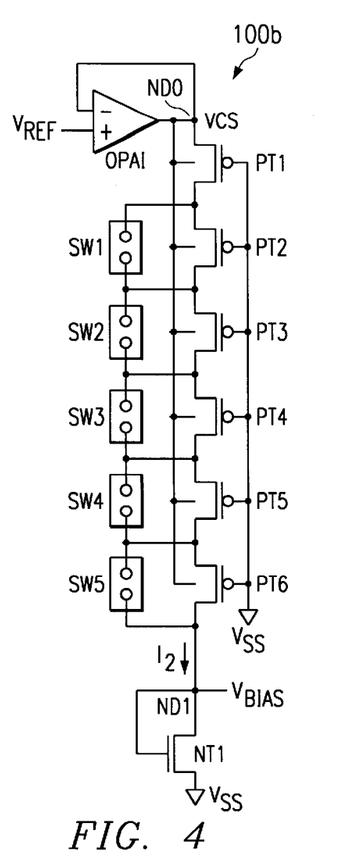
FIG. 4 is a circuit diagram showing Embodiment 2 of an oscillator circuit related to this invention.

FIG. 4 is a circuit diagram showing Embodiment 2 of an oscillator circuit related to this invention. In FIG. 4 only the section of the current source 100b in Embodiment 2 is shown, and the ring oscillator 200 that conducts the oscillator operations by the current supplied by means of the current source 100b is omitted. The construction and operation of the ring oscillator 200 is the same as in Embodiment 1 shown in FIG. 1.

As is shown in FIG. 4, as for the current source 100b in this embodiment compared with the current source 100a of Embodiment 1, excepting the point that it receives the reference voltage $V_{REF}$ in place of the nMOS transistor NT0 and uses an op-amp OPA1 that outputs a constant voltage VCS in response to that, all of the other sections are the same.

The reference voltage $V_{REF}$ is input to the input terminal "+" of the op-amp OPA1. This reference voltage, for example, is a stabilized voltage having little temperature dependence. The inverted input terminal "−" of the op-amp OPA1, along with its output terminal, are connected to the node ND0. In other words, a voltage follower is formed by means of the op-amp OPA1, and the voltage of the output terminal of the op-amp OPA1, in other words, the voltage VCS of the node ND0, is held at the same level as the reference voltage $V_{hd\ REF}$.

Because of this, in the event the reference voltage $V_{hd\ REF}$ is a constant voltage with a low temperature dependency, the voltage VCS of the node ND0 also becomes a stabilized voltage that is not influenced by temperature changes. By means of adjusting the reference voltage $V_{hd\ REF}$ and holding the voltage VCS of the node ND0 at a level of, for example, less than 1.7 V, a current $I_1$ can be obtained having positive temperature characteristics by means of the current source 100b of this embodiment. In other words, the current value of the current $I_2$ increases accompanying a rise in temperature, and conversely, the current value of the current $I_2$ decreases accompanying a lowering of the temperature.

Also, in the same manner as in Embodiment 1, since a current corresponding to the current $I_2$ having positive temperature characteristics obtained from the current source 100b is supplied to the ring oscillator 200 in which the oscillating frequency becomes higher accompanying an increase in the supplied current, the frequency of the clock signal CLK obtained from the ring oscillator 200 has positive temperature characteristics. In other words, the frequency of the clock signal CLK rises in response to a temperature rise, and the clock signal CLK falls in response to a temperature drop. Due to the fact that the refresh operation of the DRAM is controlled in response to the clock signal CLK, the data holding capabilities can be ensured during high temperatures, and wasteful power consumption can be suppressed during low temperatures.

What is claimed is:

1. An oscillator having;
   a ring oscillator wherein an odd number of signal inverting means are connected in series and a current supply means for the purpose of supplying current to the signal inverting means, and
   a reference current generating circuit that generates a reference current having positive temperature characteristics that becomes the reference for the current which the current supply circuit supplies, wherein the reference current generating circuit comprises an active transistor device to provide the positive temperature characteristic,
   wherein the signal inverting means is constructed of CMOS inverters, the current supply means contains pMOS transistors and nMOS transistors that are connected between the power supply terminal and the ground terminal, the reference current generating circuit contains a diode-connected first MOS transistor, a plurality of positive temperature coefficient pMOS transisitors and a diode-connected second MOS transistor that are connected between the power supply terminal and the ground terminal.

2. A semiconductor memory circuit having an oscillator for generating a clock signal comprising:

a ring oscillator wherein an odd number of signal inverting means are connected in series and a current supply means for the purpose of supplying current to the signal inverting means, and a reference current generating circuit that generates a reference current having positive temperature characteristics that becomes the reference for the current which the current supply circuit supplies, wherein the reference current generating circuit comprises an active transistor device to provide the positive temperature characteristic, wherein the signal inverting means is constructed of CMOS inverters, the current supply means contains pMOS transistors and nMOS transistors that are connected between the power supply terminal and the ground terminal, the reference current generating circuit contains a diode-connected first MOS transistor, a plurality of pMOS transitors that provide the positive temperature characteristic, and a diode-connected second MOS transistor that are connected between the power supply terminal and the ground terminal.

3. The semiconductor memory in claim 2 wherein the voltage VCS, the voltage at the source of the diode connected first MOS transistor, is less than about 1.7 V.

4. A semiconductor memory circuit having an oscillator for generating a clock signal comprising:

a ring oscillator having an odd number of signal inverters connected in series, a current supply for the purpose of supplying current to the signal inverters, a reference current generating circuit for the current supply that generates a reference current having positive temperature characteristics, wherein the reference current generating circuit comprises a plurality of serially connected pMOS transistors that provide the positive temperature characteristic.

5. The semiconductor memory circuit of claim 4 further comprising a first nMOS transistor diode connected with the gate and drain connected to a supply voltage and the source connected to a top node of the serially connected pMOS transistors, and a diode-connected second nMOS transistor connected between a bottom node of the serially connected pMOS transitors and a common potential terminal.

6. The semiconductor memory in claim 5 further comprising a plurality of switches connected across one or more of the serially connected pMOS transistors.

7. The semiconductor memory in claim 6 wherein the voltage VCS, the voltage at the source of the diode connected first MOS transistor, is less than about 1.7 V.

* * * * *